US012237174B2

(12) United States Patent
Shinoda et al.

(10) Patent No.: US 12,237,174 B2
(45) Date of Patent: Feb. 25, 2025

(54) ETCHING METHOD

(71) Applicant: Hitachi High-Tech Corporation, Tokyo (JP)

(72) Inventors: Kazunori Shinoda, Tokyo (JP); Hirotaka Hamamura, Tokyo (JP); Kenji Maeda, Tokyo (JP); Kenetsu Yokogawa, Tokyo (JP); Kenji Ishikawa, Aichi (JP); Masaru Hori, Aichi (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/642,356

(22) PCT Filed: Apr. 22, 2021

(86) PCT No.: PCT/JP2021/016333
§ 371 (c)(1),
(2) Date: Mar. 11, 2022

(87) PCT Pub. No.: WO2022/224412
PCT Pub. Date: Oct. 27, 2022

(65) Prior Publication Data
US 2024/0047222 A1 Feb. 8, 2024

(51) Int. Cl.
*H01L 21/311* (2006.01)
*H01L 21/02* (2006.01)
*H01L 21/3065* (2006.01)

(52) U.S. Cl.
CPC .. *H01L 21/31122* (2013.01); *H01L 21/02183* (2013.01); *H01L 21/3065* (2013.01)

(58) Field of Classification Search
CPC ......... H01L 21/31122; H01L 21/02183; H01L 21/3065; H01L 21/32136
See application file for complete search history.

(56) References Cited

U.S. PATENT DOCUMENTS

2004/0058528 A1    3/2004   Eissa et al.
2017/0053810 A1*   2/2017   Yang ............... H01L 21/67069
(Continued)

FOREIGN PATENT DOCUMENTS

JP    2004119977 A    4/2004
JP    2017063186 A    3/2017
(Continued)

OTHER PUBLICATIONS

Search Report mailed Jul. 13, 2021 in International Application No. PCT/JP2021/016333.
(Continued)

*Primary Examiner* — Jonathan Han
(74) *Attorney, Agent, or Firm* — Miles & Stockbridge, P.C.

(57) ABSTRACT

Provided is an etching technique providing higher uniformity of etching amount and a higher yield of etching processing. An etching method for etching a film layer as a processing object containing nitride of transition metal, the film layer being disposed on a surface of a wafer, includes a step of supplying reactive particles containing fluorine and hydrogen but containing no oxygen to a surface of the film layer to form a reaction layer on the surface of the film layer, and a step of eliminating the reaction layer by heating the film layer.

5 Claims, 10 Drawing Sheets

(56) References Cited

U.S. PATENT DOCUMENTS

2018/0076051 A1\* 3/2018 Shinoda ............ H01L 21/32136
2021/0257196 A1  8/2021 Shawming et al.

FOREIGN PATENT DOCUMENTS

| JP | 2018041886 A | 3/2018 |
| JP | 2020502811 A | 1/2020 |
| JP | 2021-509525 A | 3/2021 |
| WO | 2018118655 A1 | 6/2018 |

OTHER PUBLICATIONS

Office Action mailed Aug. 8, 2023 in Japanese Application No. 2022-508797.

\* cited by examiner

ETCHING METHOD

TECHNICAL FIELD

The present invention relates to a plasma etching method of a film layer as a processing object containing nitride of transition metal, for example, tantalum nitride film.

BACKGROUND ART

High degree of integration of a semiconductor device has increasingly progressed due to spread of a mobile device typified by a smartphone. A three-dimensional (3D) NAND flash memory, in which memory cells are stacked in multiple stages in a three-dimensional direction, is now mass-produced in a field of a recording semiconductor device. Further, a fin field effect transistor (FET) having a fine three-dimensional structure as a structure of a transistor is now mainstream in a field of a logic semiconductor device. Stacked nanowire FET is now investigated to further improve the degree of integration.

Along with such progress of a three-dimensional device structure and of a reduction in processing dimension, there is a more need of an etching technique exhibiting isotropy and high processing dimension controllability at an atomic layer level in a device manufacturing process (manufacturing method of a semiconductor device). A wet etching technique has been widely used as such an isotropic etching technique, including etching of silicon dioxide using a mixed solution of hydrofluoric acid and ammonium fluoride, etching of silicon nitride using hot phosphoric acid, and etching of tantalum nitride using hydrofluoric acid. However, such an existing wet etching technique using a drug solution has a problem that pattern collapse caused by surface tension of a rinse liquid is actualized along with pattern size reduction.

For example, it is reported that when a high-aspect-ratio pattern of silicon is used, a threshold of a pattern interval, at which collapse begins by surface tension during drying of a rinse liquid, increases in proportion to the square of an aspect ratio with a reduction in the pattern interval. Hence, there is a strong demand for developing a process method for isotropically etching various films without any drug solution.

Meanwhile, tantalum nitride is widely used as a work function metal or a barrier metal in the above semiconductor device. Hence, there is a demand for an etching technique of tantalum nitride, which exhibits isotropy, high processing dimension controllability at an atomic layer level, and high selectivity in a process of manufacturing a next-generation semiconductor device.

For example, Japanese Unexamined Patent Application Publication No. 2004-119977 (patent literature 1) is provided as an existing technique of isotropically etching a tantalum nitride film using plasma without any drug solution.

Patent literature 1 discloses a technique as a method of selectively removing tantalum nitride by etching in a structure including a tantalum nitride layer as a barrier metal and copper as an interconnection material, in which a copper surface is first passivated by plasma of ammonia ($NH_3$) and nitrogen ($N_2$), and then tantalum nitride is selectively etched with respect to copper by plasma of tetrafluoroethylene ($C_2F_4$) and oxygen ($O_2$).

CITATION LIST

Patent Literature

Patent literature 1: Japanese Unexamined Patent Application Publication No. 2004-119977.

SUMMARY OF INVENTION

Technical Problem

Each of the above existing techniques problematically has not given a sufficient consideration on the following point.

Specifically, although a technique of selectively etching tantalum nitride with respect to copper is disclosed as the existing technique, such a technique has not given a consideration on a condition of processing of selectively etching a film containing carbon, such as a carbon hard mask, as a mask material as in a fabrication process of a work function metal. In particular, no consideration has been given on a fact that when etching is required to be conformal at an atomic layer level in a fine three-dimensional structure as in a fabrication process of a work function metal in fin FET or stacked nanowire FET, etching rate is different between a top and a bottom of a pattern, leading to a vertical variation in dimension of thickness of a processed object as a result of etching processing. Hence, the existing technique has the following problem: large distribution occurs in etching amount of a film layer as a processing object in a vertical (depth) direction of a pattern formed in a film structure, which reduces a yield of etching processing (etching step) of a semiconductor device.

Further, etching of a tantalum nitride film by the existing technique continuously proceeds with an increase in etching time. In such a continuous etching process, etching amount is adjusted by detecting and adjusting time after start of the etching processing. Such adjustment of etching amount with etching processing time is difficult to accurately adjust an extremely small amount of etching, for example, etching to a depth (width) at an atomic layer level, which may reduce accuracy and a yield of etching processing.

In this way, the continuous plasma etching technique in the past provides nonuniform etching amount in reflection of radical distribution, resulting in less uniform etching amount in a wafer in-plane direction or a pattern depth direction, and must control the etching amount with plasma processing time. The continuous plasma etching technique in the past is therefore considered to be limitedly used in next and future generations of a device manufacturing process requiring high dimension controllability at an atomic layer level.

An object of the invention is to provide an etching technique that provides highly uniform etching amount and an improved yield of etching processing.

Other objects and novel features of the invention will be clarified from the content of this description and the accompanied drawings.

Solution to Problem

A typical embodiment of the invention is briefly summarized as follows.

An etching technique according to one embodiment of the invention includes an etching method for etching a film layer as a processing object containing nitride of transition metal including tantalum nitride, the film layer being disposed on a surface of a wafer, the method comprising the steps of supplying reactive particles containing fluorine and hydrogen but containing no oxygen to a surface of the film layer to form a reaction layer which mainly contains a tantalum-fluorine bond and nitrogen-hydrogen bond and has a self-saturating tendency on the surface of the film layer, and a step of eliminating the reaction layer by heating the film layer.

Advantageous Effects of Invention

An advantageous effect typically obtained by the invention is briefly described as follows.

According to the etching technique of the invention, it is possible to improve uniformity of the etching amount and a yield of etching processing. For example, the invention can provide an isotropic atomic-layer etching technique to perform etching processing on a tantalum nitride film with high uniformity of etching amount in a wafer in-plane direction or a pattern depth direction, and with high processing dimension controllability at an atomic layer level, for example, in case of etching a tantalum nitride film being a film layer as a processing object containing nitride of transition metal.

DESCRIPTION OF EMBODIMENT

Hereinafter, an embodiment of the invention is described with reference to drawings. In the following description, corresponding components are designated by corresponding reference numerals or signs, and duplicated description may be omitted. Although the drawings may be schematically shown compared with an actual aspect to more clarify the description, such an aspect is merely an example and should not restrict interpretation of the invention.

In a process of manufacturing a semiconductor device, for example, fin FET, processing of forming a work function metal is considered to require a technique of isotropically etching a tantalum nitride film, which is formed on a fine fin structure with a high aspect ratio, at a high accuracy of an atomic layer level. Thus, the inventors have investigated on an exemplary case where a structure as shown in FIG. 10 is etched using plasma according to an existing technique.

Figure 10:
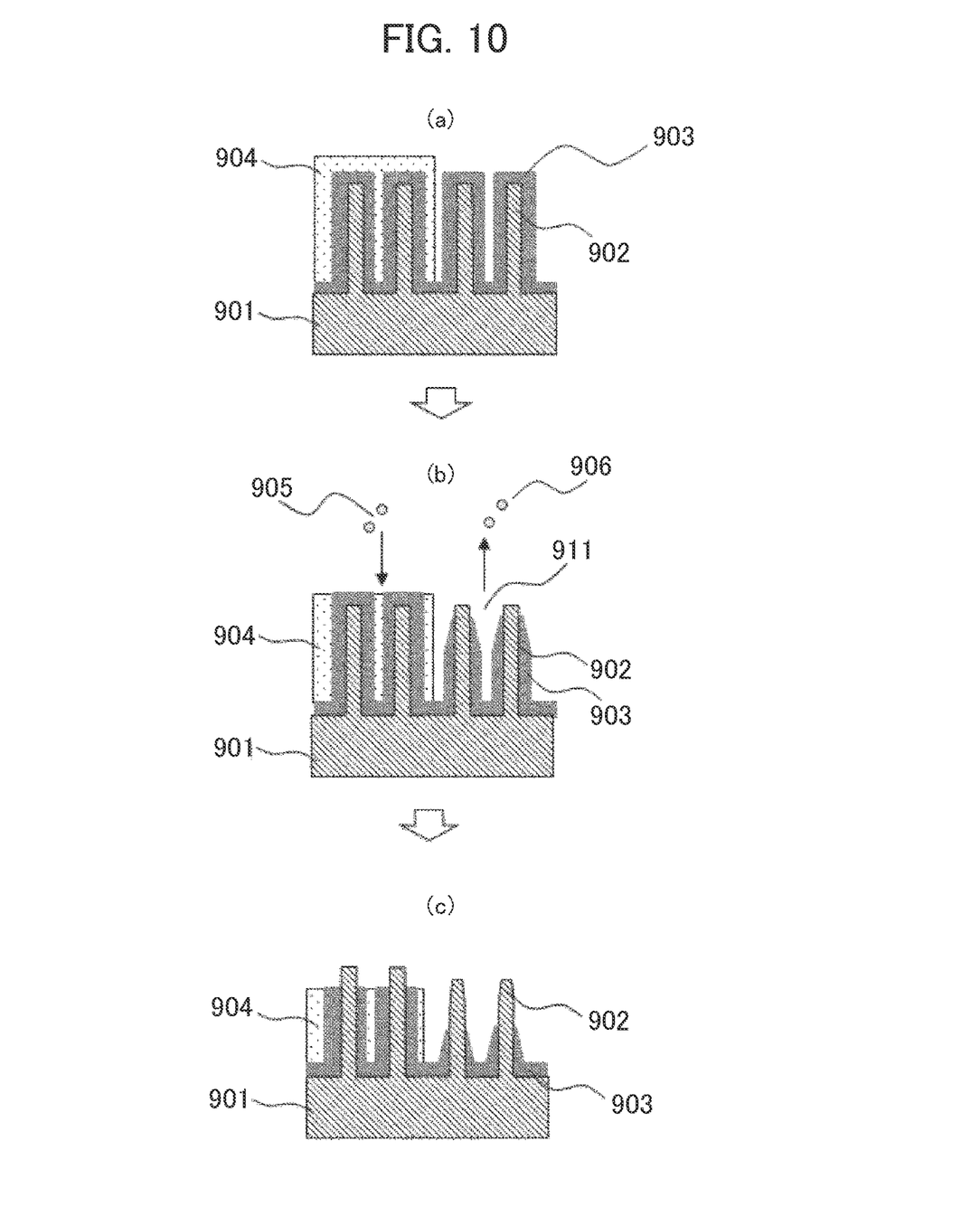
FIG. 10 is a longitudinal section schematically illustrating change in a fine film structure formed on a sample on a substrate such as a semiconductor wafer as a processing object and having a high aspect ratio when the film structure is subjected to plasm etching according to a technique in the past.

FIG. 10 is a longitudinal section schematically illustrating change in a predetermined structure, which is formed on a sample on a substrate such as a semiconductor wafer as a processing object with a plurality of fin structures formed laterally adjacent to each other, when the structure is subjected to plasm etching according to the existing technique. In FIG. 10, (a) to (c) show states at three stages of a shape of the film structure changed through the etching processing.

In FIG. 10, (a) illustrates a film structure before start of etching processing using plasma, in which a tantalum nitride film 903 as a processing object and a carbon film 904 as a mask protecting a portion of the tantalum nitride film 903 to be not processed are formed on a surface of a fin structure 902 formed on a base structure 901. In FIG. 10, (b) illustrates a state where etching of the tantalum nitride film 903 has proceeded, i.e., a state in which a gas including tetrafluoroethylene ($C_2F_4$) and oxygen ($O_2$) (hereinafter referred to as $C_2F_4/O_2$ gas) is used to form plasma, a reactive species 905 containing fluorine in the plasma is supplied into a trench 911 of the film structure to react with a surface of the tantalum nitride film 903, and a generated reaction product 906 containing tantalum fluoride is removed upward. In FIG. 10, (c) illustrates a stopped state of the etching of the tantalum nitride film 903 using the plasma. In this exemplary case, the fin structure 902, configured of silicon, is beforehand formed on the base structure 901 while having a surface covered with undepicted hafnium oxide or titanium nitride.

Through investigations of the inventors, as shown in (b) of FIG. 10, it is found that when only the tantalum nitride film 903 is tried to be uniformly etched inside the trench 911 having a high aspect ratio, the trench having a sidewall on either side configured of a structure in which a surface of the fin structure 902 is covered with the tantalum nitride film 903, since a gas chemistry causing a nonvolatile reaction product 906 is not used, no nonvolatile surface reaction layer is formed on a surface of the tantalum nitride film 903, and etching continuously proceeds through continuous elimination of the volatile reaction product 906. On the other hand, a reaction species 905 supplied from the plasma formed above the sample enters the trench 911 from above the trench 911 and is consumed by the tantalum nitride film 903 formed in the vicinity of an opening at an upper end of the trench 911. This results in a reduction in the amount of the reaction species 905 reaching the tantalum nitride film 903 in a lower region of the trench 911 (bottom of the trench 911). Hence, distribution of the etching amount of the tantalum nitride film 903 becomes nonuniform in a vertical direction of the trench 911, and in turn the etching amount of the tantalum nitride film 903 is larger near the opening on the upper side of the trench 911 and smaller on the lower side thereof. As a result, etching of the tantalum nitride film 903 by the existing technique leads to nonuniform distribution of the etching amount of the tantalum nitride film 903, which may reduce a yield of sample processing or manufacturing of a semiconductor device.

As shown in (b) and (c) of FIG. 10, in the existing isotropic etching of tantalum nitride using plasma of $C_2F_4$/$O_2$ gas, etching of the carbon film 904 used for protecting a portion of the tantalum nitride film 903 to be not etched also continuously proceeds because a large amount of oxygen radicals are contained in the plasma. Thus, thickness of the carbon film 904 is increasingly reduced with progress of etching of the tantalum nitride film 903, which substantially makes it difficult to protect the tantalum nitride film 903.

As described above, in the existing etching technique using plasma, the etching amount of the tantalum nitride film 903 is nonuniform in reflection of radical distribution, leading to poor uniformity of the etching amount of the tantalum nitride film 903 in a wafer in-plane direction or a pattern depth direction. In addition, the etching amount of the tantalum nitride film 903 must be controlled with plasma processing time. The existing continuous plasma etching technique is therefore considered to be limitedly used in in next and future generations of a device manufacturing process requiring high dimension controllability at an atomic layer level.

The inventors have attempted to etch a tantalum nitride film using plasma of various gases. As a result, it has been found that:

(1) plasma of a gas containing fluorine, hydrogen, and nitrogen is supplied to a tantalum nitride film, thereby a surface reaction layer mainly containing the tantalum-fluorine (Ta—F) bond and the nitrogen-hydrogen (N—H) bond is formed on a surface of the tantalum nitride film;

(2) production of the surface reaction layer is self-saturating (self-limiting); and (3) the surface reaction layer is removed by heating.

The invention is achieved based on such novel findings (1) to (3). An etching method of a tantalum nitride film (film layer as a processing object) as a nitride of transition metal specifically includes performing a step of forming plasma of a gas containing methane tetrafluoride ($CF_4$), hydrogen ($H_2$), and nitrogen ($N_2$) to supply reactive particles containing fluorine and hydrogen from the plasma but containing no oxygen to a surface of a tantalum nitride film to be etched and thus form a surface reaction layer on a surface of the tantalum nitride film, and a step of removing the surface reaction layer by heating (or a step of eliminating the surface reaction layer by heating). Such two steps are combined as one cycle, and the cycle is repeated multiple times to achieve etching of a desired amount of a tantalum nitride film. Since etching rate of the gas is low for a carbon film, a mask material containing carbon such as a carbon hard mask may be used without limitation.

According to the above configuration, the formation step and the removal step of the surface reaction layer are each self-saturating, which suppresses nonuniformity of the etching amount in a wafer in-plane direction and in a depth direction of a pattern of a film structure, such as a trench or a hole. Thickness of a tantalum nitride film removed in one cycle can be adjusted at high accuracy of an atomic-layer level, and the etching amount obtained through repetition of the cycle can be adjusted by the number of cycle times, making it possible to improve dimension accuracy of a semiconductor device formed by etching of a stacked tantalum nitride film.

Figure 9:
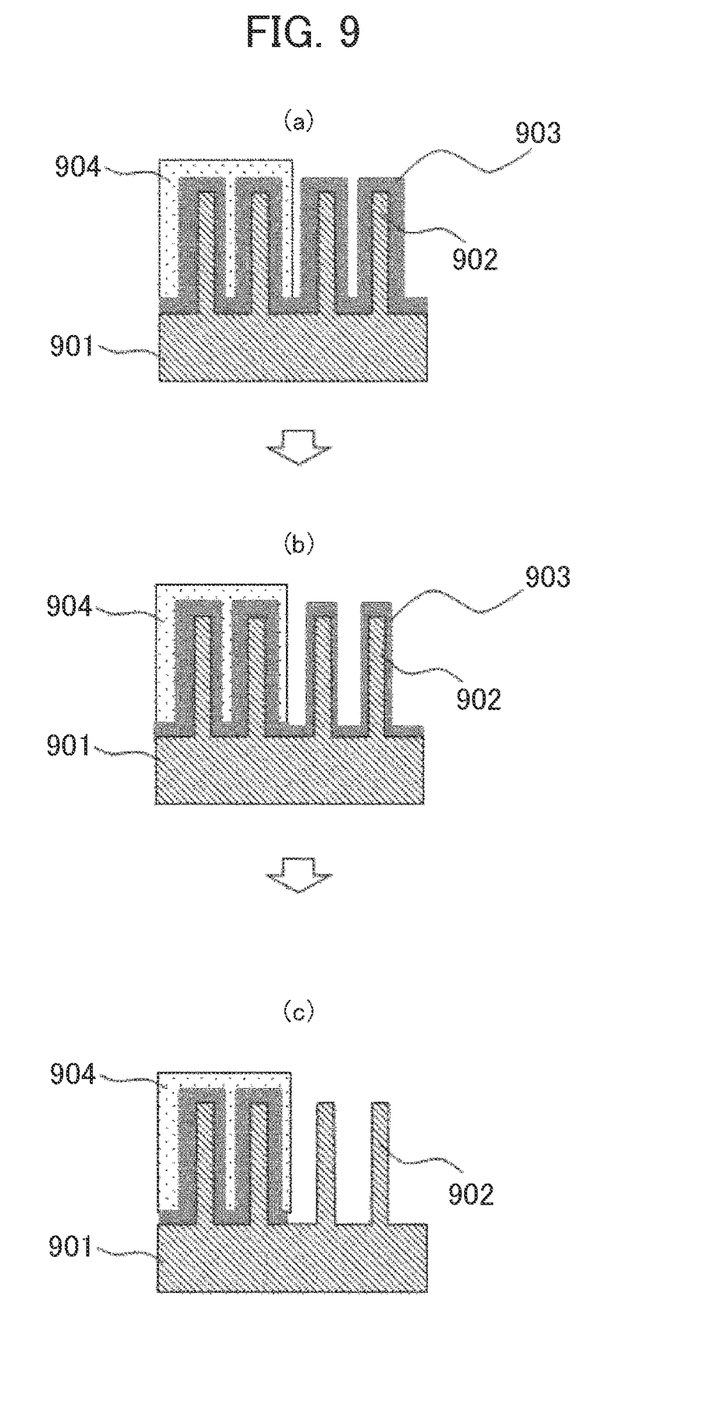
FIG. 9 is a longitudinal section schematically illustrating change in a fine film structure formed on a sample on a substrate such as a semiconductor wafer as a processing object and having a high aspect ratio when the film structure is subjected to plasm etching according to the embodiment.

FIG. 9 is a longitudinal section schematically illustrating change in a fine film structure that is formed on a sample on a substrate such as a semiconductor wafer as a processing object and has a high aspect ratio when the film structure is subjected to plasm etching according to the technique of the invention. In FIG. 9, (a) to (c) show states at three stages of a shape of the film structure changed through the etching processing.

In FIG. 9, (a) illustrates a film structure before start of etching processing using plasma, in which a tantalum nitride film 903 to be processed and a carbon film 904 being a mask layer containing carbon as a mask protecting a portion of the tantalum nitride film 903 to be not processed are formed on a surface of a fin structure 902 formed on a base structure 901. As in (b) of FIG. 9, a surface reaction layer is formed for etching of the tantalum nitride film 903 having the film structure of (a) of FIG. 9: plasma of a mixed gas containing methane tetrafluoride ($CF_4$), hydrogen ($H_2$), and nitrogen ($N_2$) is formed, and reactive particles containing fluorine and hydrogen from the plasma but containing no oxygen are supplied to a surface of a tantalum nitride film 903 as an etching object uncovered with the carbon film 904, so that a surface reaction layer is formed on a surface of the tantalum nitride film 903 to be etched. Subsequently, the surface reaction layer is removed (eliminated) by heating. In other words, a step of forming the surface reaction layer and a step of eliminating the surface reaction layer by heating are performed. Such two steps are combined as one cycle, and the cycle is repeated multiple times to achieve a desired amount of etching of a tantalum nitride film. Consequently, as illustrated in (c) of FIG. 9, the tantalum nitride film 903 as an etching object uncovered with the carbon film 904 can be selectively removed by etching. Description of (a) to (c) of FIG. 4 can be referred for more detailed description of (a) to (c) of FIG. 9.

In the following embodiment, the etching processing, in which the set of self-saturating steps including the step of forming the surface reaction layer and the step of removing the surface reaction layer is repeated, is referred to as atomic layer etching. In the embodiment, "atomic layer" etching is not limited to the atomic layer etching in a narrow sense meaning that the etching amount per cycle is equivalent to layer thickness corresponding to one atom of a substance composing the objective film. Even if the etching amount per cycle is in an order of nanometer or more, when each step is likely to be self-saturating, i.e., self-limiting in processing time or the like, such processing is referred to as atomic layer etching. Names, such as "digital etching", "self-limiting cycle etching", "atomic level etching", and "layer-by-layer etching", can also be used for the equivalent processing.

One embodiment of the invention is now described with reference to drawings.

Embodiment

The embodiment of the invention is now described with reference to FIGS. 1 to 8. The embodiment is described with an embodiment, in which a step is performed to form a surface reaction layer on a surface of a tantalum nitride film as a processing object by plasma formed using a mixed gas including methane tetrafluoride or carbon tetrafluoride ($CF_4$), hydrogen ($H_2$), and nitrogen ($N_2$), and then a step is performed to remove the surface reaction layer by wafer heating using an infrared lamp, thereby isotropic atomic-layer etching is performed on the tantalum nitride film as a processing object beforehand formed on a semiconductor wafer such as a silicon wafer.

Figure 1:
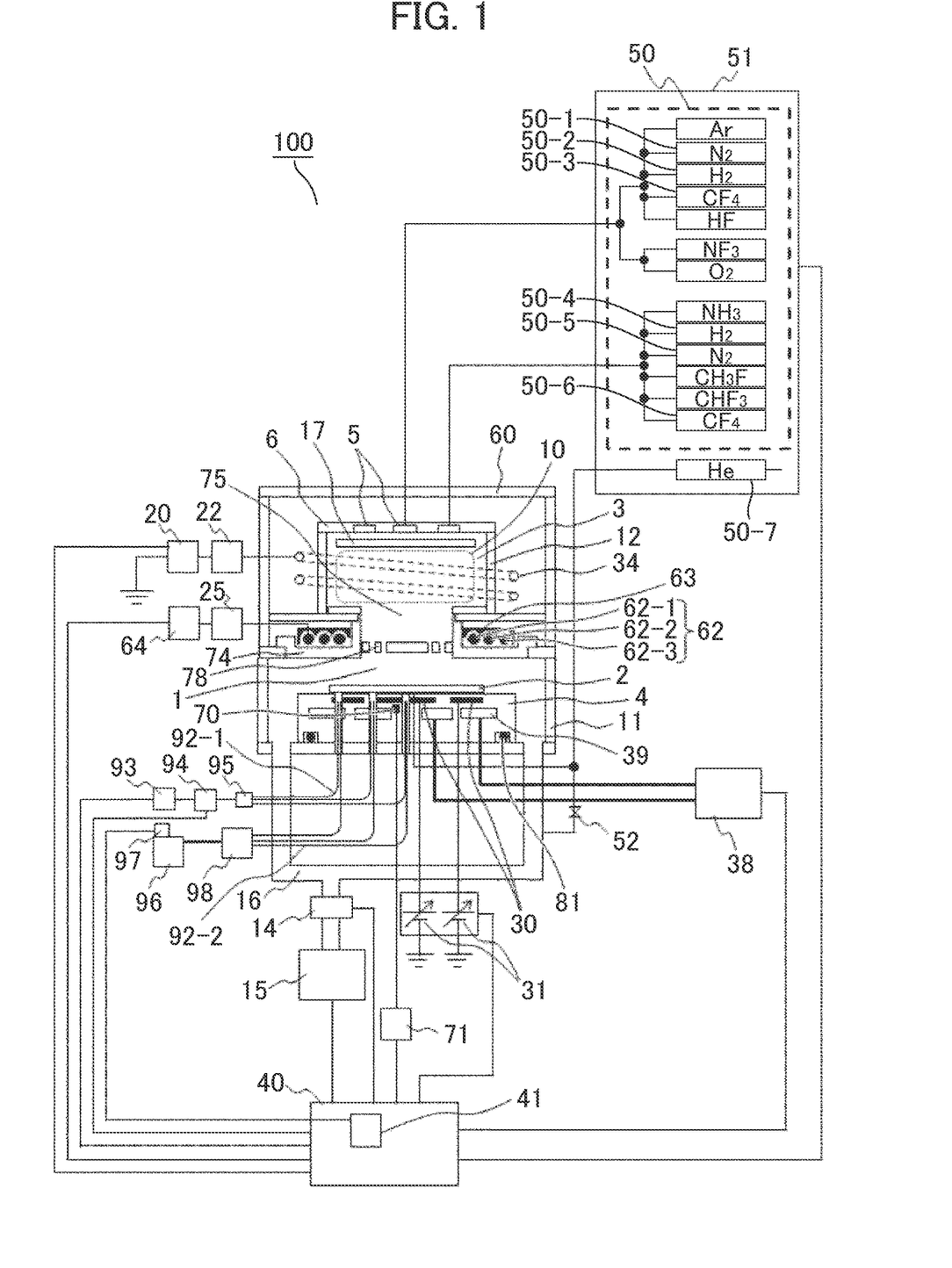
FIG. 1 is a longitudinal section schematically illustrating an outline of a configuration of a plasma processing apparatus according to an embodiment of the invention.

FIG. 1 is a longitudinal section schematically illustrating an outline of a configuration of a plasma processing apparatus according to the embodiment of the invention.

A processing chamber 1 is configured of a base chamber 11, in which a wafer stage 4 (hereinafter, mentioned as stage 4) is provided to mount a wafer 2 as a sample to be processed (hereinafter, mentioned as wafer 2). An inductively-coupled-plasma discharge type is used as a type of a plasma source. The plasma source includes a quartz chamber 12, an ICP coil 34, and a high-frequency power source 20 and is provided above the processing chamber 1. The ICP coil 34 is provided outside the quartz chamber 12.

The ICP coil 34 is connected to the high-frequency power source 20 for plasma generation via a matching box 22. A frequency band of several tens megahertz such as 13.56 MHz is used as a frequency of high-frequency power. A top board 6 is provided on the upper side of the quartz chamber 12. A shower plate 5 is provided in the top board 6, and a gas dispersion plate 17 is provided below the shower plate 5. Processing gas is introduced into the processing chamber 1 through the periphery of the gas dispersion plate 17.

Flow rate of the supplied processing gas is adjusted by a mass flow controller 50 disposed for each gas species in a mass-flow-controller control part 51. In FIG. 1, methane tetrafluoride or carbon tetrafluoride ($CF_4$), hydrogen ($H_2$), and nitrogen ($N_2$), or more are supplied as the processing gases into the processing chamber 1, and mass flow controllers 50-1, 50-2, 50-3, 50-4, 50-5, and 50-6 are provided for the respective gases. Other gases however may be supplied without limitation. The mass-flow-controller control part 51 also includes a mass flow controller 50-7 disposed to adjust a flow rate of He gas supplied to between a back of the wafer 2 and an upper surface of a dielectric film of the stage 4 on which the wafer 2 is mounted as described later.

The lower side of the processing chamber 1 is connected to an exhaust means 15 through an evacuation pipe 16. The exhaust means 15 is configured of, for example, a turbo molecular pump, a mechanical booster pump, or a dry pump. Pressure regulating means 14 is provided on an upstream side of the exhaust means 15. The pressure regulating means 14 is configured of a plurality of platelike flaps disposed with an axis in a traverse direction in a channel and rotating around the axis and a plate member moving across the axial direction within the channel in order to adjust pressure in the processing chamber 1 or pressure of a discharge region 3 by adjusting the flow rate of internal gas or particles in plasma 10 discharged from the processing chamber 1 upon operation of the exhaust means 15 by increasing or decreasing a channel sectional area as a sectional area in a plane perpendicular to an axial direction of the evacuation pipe 16.

An infrared lamp unit for heating the wafer 2 is provided between the stage 4 and a quartz chamber 12 configuring an ICP plasma source. The infrared lamp unit mainly includes an infrared lamp 62, a reflecting plate 63 reflecting infrared light, and a light transmitting window 74. A circular (ring-like) lamp is used as the infrared lamp 62. Light radiated from the infrared lamp 62 emits light mainly including visible light to infrared light. Herein, such light is referred to as infrared light. Although three-round infrared lamps 62-1, 62-2, and 62-3 are provided as the infrared lamp 62 in the configuration of FIG. 1, two-round or four-round infrared lamps may also be used. The reflecting plate 63 is provided above the infrared lamp 62 to reflect the infrared light downward.

The infrared lamp 62 is connected to an infrared lamp power source 64, and a high-frequency cut filter 25 is provided between the lamp 62 and the power source 64 to prevent noise of high-frequency power, which is generated for plasma generation by the high-frequency power source 20, from flowing into the infrared lamp power source 64. The infrared lamp power source 64 has a capability of independently controlling electric power supplied to each of the infrared lamps 62-1, 62-2, and 62-3, making it possible to adjust radial distribution of the heating amount of the wafer 2.

A gas channel 75 is provided in the center of the infrared lamp unit to flow the gas, supplied from the mass flow controller 50 into the quartz chamber 12, toward the processing chamber 1. A slit plate (ion screening plate) 78 having a plurality of holes is provided in the gas channel 75 to transmit only neutral gas and neutral radicals while screening ions and electrons generated in the plasma generated within the quartz chamber 12 and apply the neutral gas and radicals to the wafer 2.

A refrigerant channel 39 for cooling the stage 4 is provided inside the stage 4, and a chiller 38 circularly supplies the refrigerant. An electrostatic adsorption electrode 30 including electrode plates is buried in the stage 4 to fix the wafer 2 to the stage 4 by electrostatic adsorption while each electrode plate is connected to a direct current (DC) power source 31 for the electrostatic adsorption.

He gas can be supplied to between the back of the wafer 2 mounted on the stage 4 and the stage 4 to efficiently cool the wafer 2. A wafer-mounting surface of the stage 4 is coated with resin such as polyimide to prevent the back of the wafer 2 from being damaged even if the wafer 2 is heated or cooled while being electrostatically adsorbed by operation of the electrostatic adsorption electrode 30. A thermocouple 70 is provided inside the stage 4 to measure temperature of the stage 4 while being connected to a thermocouple thermometer 71.

Optical fibers 92-1 and 92-2 for measuring temperature of the stage 4 are provided at three places, i.e., near the center of the wafer 2 (also referred to as wafer center) mounted on the stage 4, near the radially middle of the wafer 2 (also referred to as wafer middle), and near the periphery of the wafer 2 (also referred to as wafer periphery). The optical fiber 92-1 guides infrared light from an external infrared light source 93 to the back of wafer 2 to apply the infrared light to the back of wafer 2. The optical fiber 92-2 collects part of IR light, which is transmitted and/or reflected by the wafer 2, of the IR light applied thorough the optical fiber 92-1, and transfers the collected IR light to a spectroscope 96.

The external infrared light generated by the external infrared light source 93 is transferred to an optical path switch 94 for turning on or off an optical path. Subsequently, the external infrared light is branched by an optical distributer 95 into several (three in FIG. 1) light beams that are then applied to the respective corresponding positions on a back side of the wafer 2 through the three-line optical fibers 92-1.

The infrared light absorbed and/or reflected by the wafer 2 is transferred to the spectroscope 96 through the optical fiber 92-2, and a detector 97 obtains data of wavelength dependence of spectral intensity. The obtained data of wavelength dependence of spectral intensity is sent to a calculation part 41 of a control part 40, and an absorption wavelength is calculated, and temperature of the wafer 2 can be obtained based on the absorbed wavelength. An optical multiplexer 98 is provided in the middle of the optical fiber 92-2, so that spectral measurement of light can be performed while a measurement point for the spectral measurement is switched between the wafer center, the wafer middle, and the wafer periphery. Consequently, the calculation part 41 can obtain the respective temperatures of the wafer center, the wafer middle, and the wafer periphery.

In FIG. 1, 60 indicates a container covering the quartz chamber 12, and 81 indicates an O ring for vacuum sealing between the stage 4 and a bottom of the base chamber 11.

The control part 40 controls ON/OFF of high-frequency power supply from the high-frequency power source 20 to the ICP coil 34. Further, the control part 40 controls the integrated mass flow control part 51 to adjust a type and a flow rate of a gas supplied from each mass flow controller 50 to the inside of the quartz chamber 12. In this state, the control part 40 allows the exhaust means 15 to be operated and controls the pressure regulating means 14 to adjust pressure in the processing chamber 1 to a desired pressure.

Further, the control part 40 allows the DC power source 31 for electrostatic adsorption to operate so that the wafer 2 is electrostatically adsorbed onto the stage 4, and while the mass flow controller 50-7 is allowed to operate to supply He gas to between the wafer 2 and the stage 4, control the infrared lamp power source 64 and the chiller 38 such that temperature of the wafer 2 is within a predetermined temperature range based on temperature distribution information of the wafer 2, which is obtained by the calculation part 41 based on the temperature of the inside of the stage 4 measured with the thermocouple thermometer 71 and the spectral intensity information measured by the detector 97 of near the center, near the radially middle, and near the periphery of the wafer 2.

Figure 2:
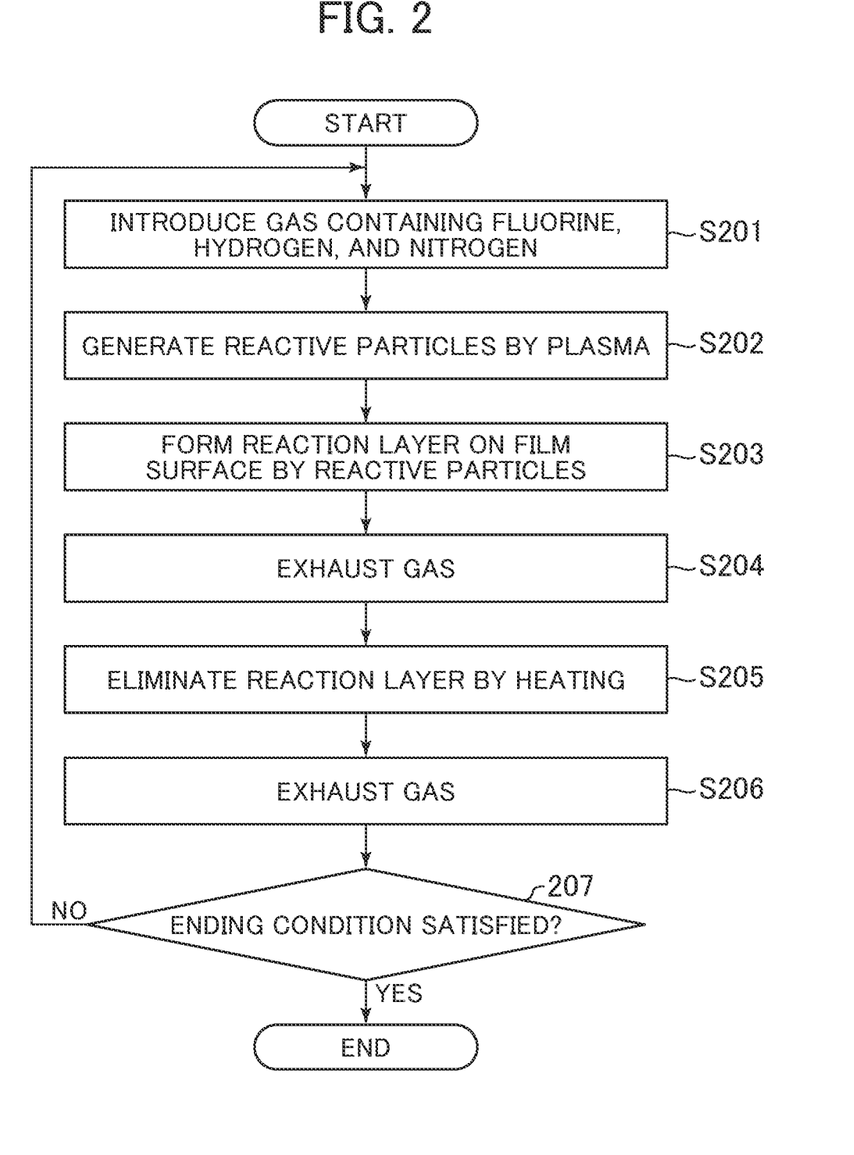
FIG. 2 is a flowchart illustrating an outline of a procedure of etching processing of a film, which contains tantalum nitride beforehand formed on a wafer, performed by the plasma processing apparatus according to the embodiment.

A procedure of processing of the wafer 2 performed by a plasma processing apparatus 100 of this embodiment is now described with reference to FIG. 2. FIG. 2 is a flowchart illustrating an outline of a procedure of etching processing of a film, which contains tantalum nitride beforehand formed on a wafer, performed by the plasma processing apparatus according to the embodiment of the invention.

With FIG. 2, before start of the processing of the wafer 2, the wafer 2 having a surface, on which a film structure including a film layer as a processing object containing a tantalum nitride film is beforehand disposed, is mounted on the stage 4 within the processing chamber 1, and held on the stage 4 by the electrostatic force formed by supply of DC power from the DC power source 31 to the electrostatic adsorption electrode 30.

When the processing is started, in step S201, a gas containing fluorine, hydrogen, and nitrogen is introduced into the processing chamber 1. As the gas containing fluorine, hydrogen, and nitrogen, for example, carbon tetrafluoride ($CF_4$)/hydrogen ($H_2$)/nitrogen ($N_2$), trifluoromethane ($CHF_3$)/ammonia ($NH_3$), and nitrogen trifluoride ($NF_3$)/ammonia ($NH_3$) can be used. A mixed gas, in which each of such gases is diluted with argon (Ar) or nitrogen ($N_2$), may also be used. In the step S201, wafer temperature is maintained constant by a temperature control function of the stage 4 on which the wafer 2 is mounted.

Subsequently, in step S202, plasma 10 is generated using the above gas inside the discharge region 3, leading to generation of particles having reactivity (also referred to as reactive particles) such as radicals (activated species) including chlorofluorocarbon radicals ($CF_X$) generated through activation of atoms or molecules of a gas containing fluorine, hydrogen, and nitrogen in the plasma 10. In step S203, the reactive particles are supplied to the surface of the wafer 2 through the gas channel 75 and the through-holes of the slit plate 78, and adhere on the surface of the film layer containing the tantalum nitride film. The reactive particles react with a material of the surface of the film layer on which the particles adhere, and thus a surface reaction layer is formed while having a thickness determined by a generation condition of the plasma 10 or a processing condition such as temperature of the stage 4. At this time, the surface reaction layer generated on the surface of the film layer containing the tantalum nitride film contains the tantalum-fluorine (Ta—F) bond and/or the nitrogen-hydrogen (N—H) bond.

Subsequently, in step S204, the control part 40 confirms formation of the surface reaction layer having a predetermined thickness by, for example, a thickness detector (not shown) or through check of the elapse of predetermined time, and then the pressure regulating means 14 enlarges channel cross section of the evacuation pipe 16 to increase displacement and thus greatly reduces pressure in the processing chamber 1. The gas containing fluorine, hydrogen, and nitrogen supplied into the processing chamber 1 is then promptly exhausted. This is the end of the formation processing of the surface reaction layer. At this time, an inert gas such as Ar may be supplied into the processing chamber 1 to replace the gas containing fluorine, hydrogen, and nitrogen within the processing chamber 1 so that discharge of the gas containing fluorine, hydrogen, and nitrogen is prompted.

Subsequently, in step S205, the infrared lamps 62 is turned on, and the surface of the wafer 2 is heated in vacuum by light (infrared light) radiated from the infrared lamps 62. At this time, irradiation time of the infrared light is, for example, 20 sec, and the highest reachable temperature of the surface of the wafer 2 is, for example, 200° C. Pressure of the processing chamber 1 during heating is, for example, $1 \times 10^{-3}$ Pa. At this time, temperature of the wafer 2 rises at a rate of, for example, 10° C./sec with an increase in irradiation time of the infrared lamp, and through such temperature rise, the surface reaction layer volatilizes from the surface and is removed (eliminated) from the surface of the film layer. After a temperature detection mechanism (92 to 97, 41) confirms that temperature of the wafer 2 has increased to a predetermined temperature, or after the control part 40 confirms the lapse of the beforehand determined time, the infrared lamp 62 is turned off.

Examples of the volatile reaction product include tantalum fluoride ($TaF_4$), ammonia ($NH_3$), and hydrofluoric acid (HF). Particles of such reaction products eliminated from the wafer 2 are discharged from the inside to the outside of the processing chamber 1 by exhaust operation in the processing chamber 1 caused by operation of the pressure regulating means 14 or the exhaust means 15 or flow of movement of the particles within the processing chamber 1 caused by the exhaust operation. Subsequently, in step S206, a gas containing a reaction product is exhausted from the inside to the outside of the processing chamber 1.

This is the end of the one cycle as a set of the steps S201 to S206. The surface reaction layer, which is formed on the surface of the tantalum nitride film through the reaction with the plasma, is removed (eliminated) through the cycle, and thus the tantalum nitride film is removed by a thickness corresponding to a thickness of the film layer of the surface reaction layer, resulting in a reduction in thickness of the tantalum nitride film. Such thickness change amount corresponds to the etching amount per the cycle.

Subsequently, the controller 40 determines whether an ending condition is satisfied, the ending condition including whether a desired etching amount is reached, which is determined from a result obtained from output of an undepicted thickness detector after receiving the output, or including the number of times of performance of the cycle, which secures the desired etching amount as derived from a previous test, for example (step S207). If the condition is determined to be satisfied (S207: yes), the etching processing of the film layer containing the tantalum nitride film is finished. If the condition is determined to be not satisfied (S207: no), the processing is returned to the step S201, and the cycle (S201 to S206) is performed again. In this way, in this embodiment, the cycle (S201 to S206) is repeated until the desired etching amount is obtained.

Figure 3:
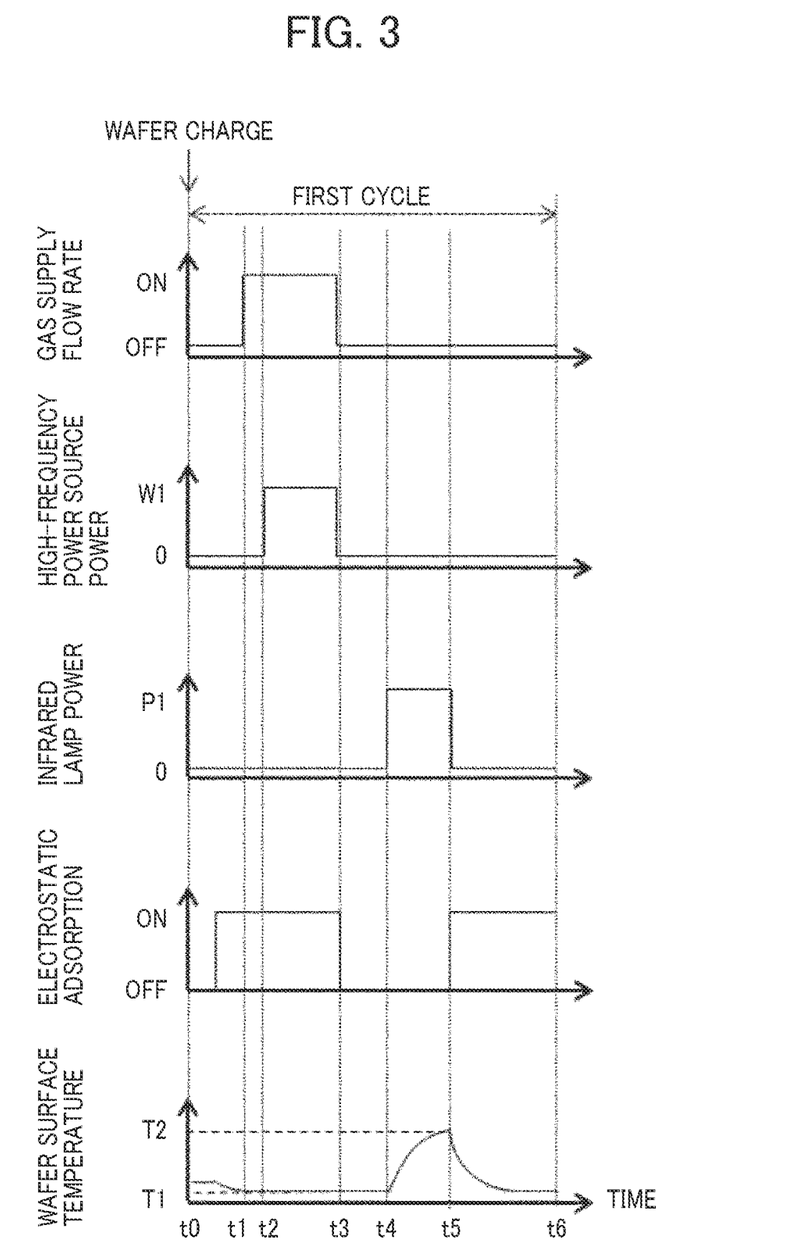
FIG. 3 is a time chart illustrating temporal change of a plurality of parameters contained in a processing condition during wafer processing according to the embodiment.

Hereinafter, description is given with reference to FIGS. 3 and 4 on operation order in case where etching of the film layer, which contains the tantalum nitride film on the wafer 2, using the plasma processing apparatus 100 of this embodiment is performed using $CF_4/H_2/N_2$ as the gas for forming the reaction layer. FIG. 3 is a time chart illustrating temporal change of a plurality of parameters contained in a processing condition during processing of a wafer according to the embodiment as shown in FIG. 1. In FIG. 3, gas supply flow rate, high-frequency power source power, infrared lamp power, electrostatic adsorption, and wafer surface temperature are shown as parameters in this order from above.

Figure 4:
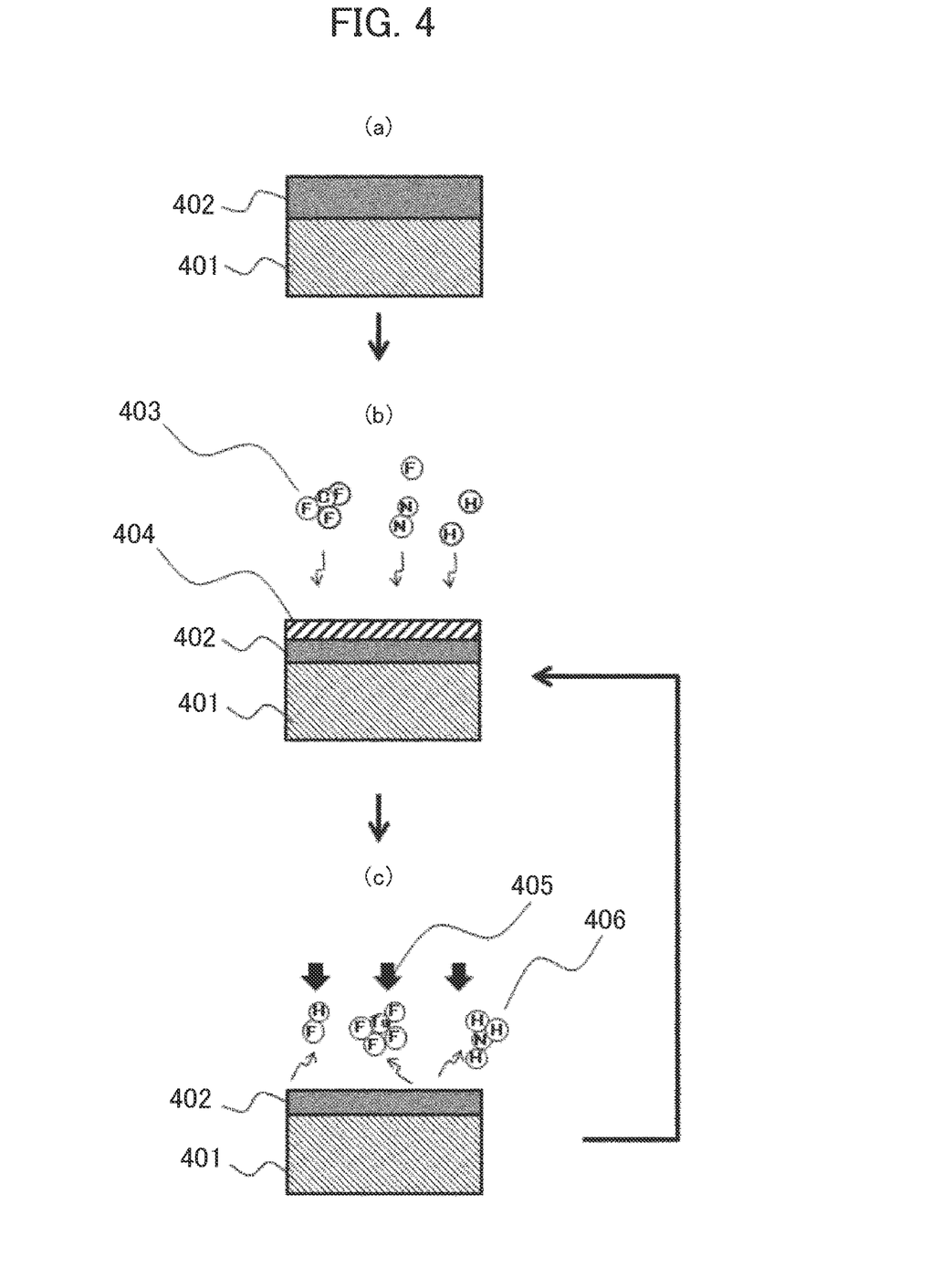
FIG. 4 is a sectional view schematically illustrating an outline of change in film structure containing a film containing tantalum nitride during processing of the wafer, according to the embodiment.

FIG. 4 is a sectional view schematically illustrating an outline of change in film structure containing the film layer containing the tantalum nitride film during processing of the wafer according to the embodiment as illustrated in FIG. 3. In particular, FIG. 4 schematically illustrates a structure near a surface of a tantalum nitride film 402 of a film structure, in which the tantalum nitride film 402 is stacked and disposed bordering on a base film 401 of the wafer 2, and change in the structure.

First, at time t0 during processing as shown in FIG. 3, according to an instruction signal from the control part 40, the wafer 2, on which a film structure including the base film 401 and the tantalum nitride film 402 being a film layer as an object of etching processing as shown in (a) of FIG. 4 is beforehand formed, is carried into the processing chamber 1 via a conveyance port (not shown) provided in the processing chamber 1 and mounted on the stage 4. Subsequently, power from the DC power source 31 is supplied to the electrostatic adsorption electrode 30 so that the wafer 2 is electrostatically adsorbed and held on the dielectric film on the stage 4. Further, according to an instruction signal from the control part 40, the mass flow controller 50-7 for He gas of the mass-flow-controller control part 51 supplies He gas for wafer cooling into a gap between the back of the wafer 2 and the stage 4 while adjusting flow rate of the He gas, so that pressure of the He gas in the gap is adjusted to a value within a predetermined range. As a result, heat transfer between the stage 4 and the wafer 2 is prompted, and temperature of the wafer 2 is adjusted to a value T1 similar to temperature of the stage 4 in which the refrigerant, the temperature of which is beforehand adjusted to a predetermined temperature by the chiller 38, is supplied into the refrigerant channel 39 and circulates through the channel 39. In this embodiment, the temperature T1 of the wafer 2 is adjusted to −20° C., for example.

Subsequently, at time t1 shown in FIG. 3, according to an instruction signal from the control part 40, flow rates of the respective gases supplied by the mass flow controller 50-3 or 50-6 for $CF_4$, the mass flow controller 50-2 or 50-4 for $H_2$, and the mass flow controller 50-1 or 50-5 for $N_2$ are adjusted, and a mixed gas as a mixture of the gases of such multiple kinds of substances is supplied as a processing gas into the processing chamber 1 at a flow rate within a beforehand determined range. Concurrently, the opening degree of the pressure regulating means 14 is adjusted so that pressure in the processing chamber 1 and pressure in the discharge region 3 within the quartz chamber 12 are each adjusted to a value within a predetermined range.

In this state, at time t2 shown in FIG. 3, according to an instruction signal from the control part 40, high-frequency power having a predetermined value W from the high-frequency power source 20 is supplied to the ICP coil 34, and plasma discharge is started in the discharge region 3 within the quartz chamber 12, so that the plasma 10 is generated inside the quartz chamber 12. At this time, no power is supplied to the infrared lamp 62 to maintain temperature of the wafer 2 during generation of the plasma 10 to be equivalent to temperature before generation of the plasma 10.

In this state, at least some of particles of the $CF_4/H_2/N_2$ gas are excited, dissociated, or ionized, leading to formation of reactive particles, including charged particles such as ions or active species. The reactive particles such as the active species and neutral gas formed in the discharge region 3 are introduced into the processing chamber 1 through slits or the through-holes formed in the slit plate 78 and supplied to the surface of the wafer 2. As illustrated in (b) of FIG. 4, active species 403 including chlorofluorocarbon radicals ($CF_X$) is adsorbed on the surface of the tantalum nitride film 402 and interacts with a material of the tantalum nitride film 402, resulting in formation of a surface reaction layer 404. That is, reactive particles 403 containing fluorine and hydrogen but containing no oxygen are supplied to the surface of the film layer of the tantalum nitride film 402 to form the surface reaction layer 404 on the surface of the film layer of the tantalum nitride film 402.

Figure 5:
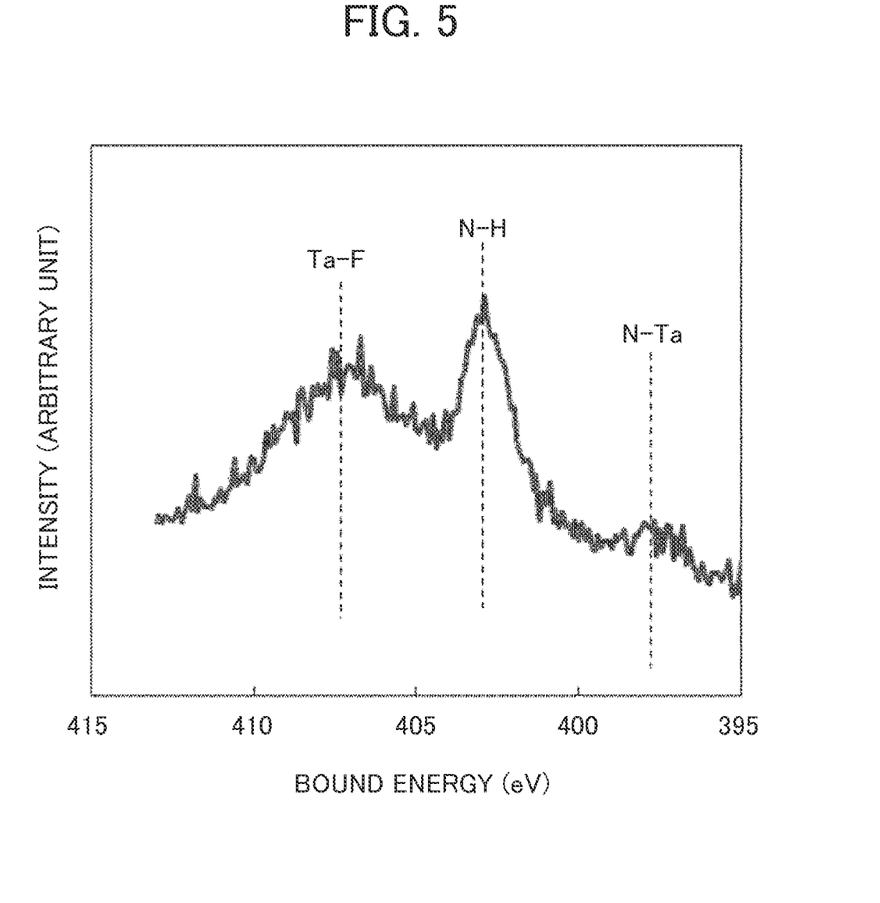
FIG. 5 illustrates analysis results of a wafer surface, according to the embodiment.

The surface reaction layer 404 includes a reaction product mainly containing the Ta—F bond and the N—F bond, and is largely characterized in that binding energy of N is spectrum has a peak near 402±2 eV when being measured by X-ray photoelectron spectroscopy using an Al—Kα ray. FIG. 5 illustrates a photoelectron spectrum when the surface of the tantalum nitride film 402 having the surface reaction layer 404 thereon is analyzed by X-ray photoelectron spectroscopy using an Al—Kα ray. A peak due to the surface reaction layer 404, which shows existence of the N—H bond, is observed near a binding energy of 402±2 eV in addition to a peak (indicated as N—Ta) observed near a binding energy of 398±2 eV due to an unreacted tantalum nitride film 402 as a base. A peak due to the surface reaction layer 404, which shows existence of the Ta—F bond, is observed near a binding energy of 407±2 eV. The composition of the surface reaction layer may be in a mixed state of various bonding states of hydrogen, nitrogen, fluorine, and tantalum, including simple hydrogen, simple fluorine, $NH_3$, and tantalum fluoride depending on a composition of a used gas or reaction time, or may contain a slight amount of oxygen due to surface oxide of the tantalum nitride film. The binding energy values shown herein are calibrated values assuming a peak position of C 1s due to surface contamination carbon observed on a surface of an initial sample is 284.5 eV.

Figure 6:
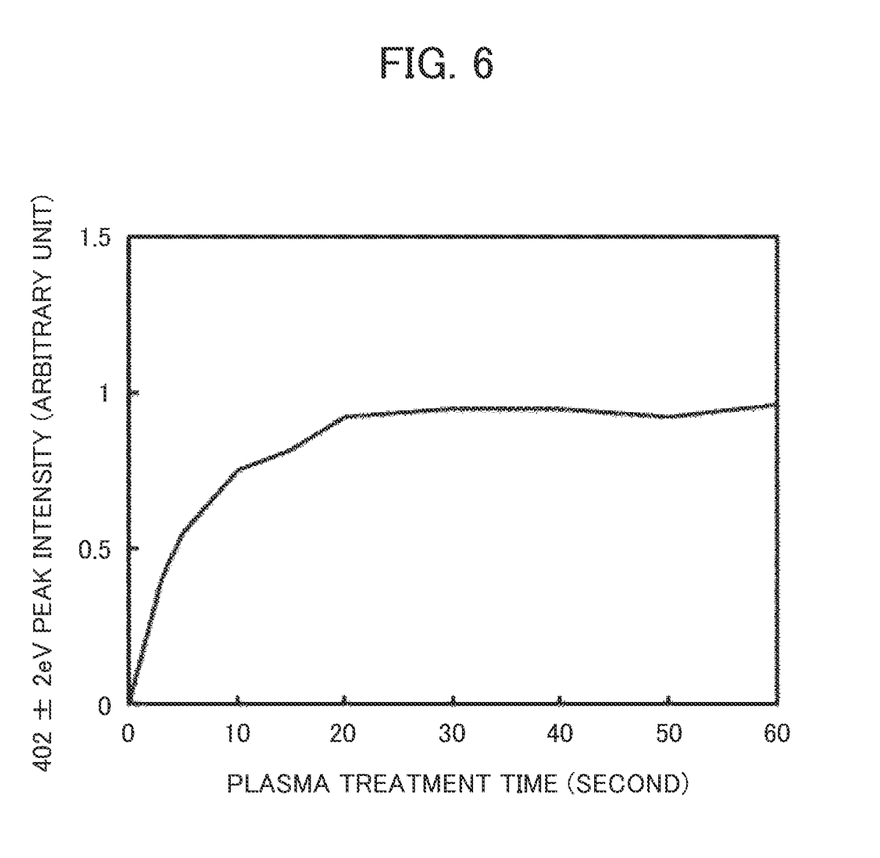
FIG. 6 illustrates reaction time dependence of production of a surface reaction layer according to the embodiment.

FIG. 6 is a graph illustrating dependence of the peak intensity of 402±2 eV due to the surface reaction layer 404 on plasma processing time. The plasma processing time shows elapsed time since supply of high-frequency power is started. As shown in FIG. 6, the peak intensity of 402±2 eV due to the surface reaction layer 404 increases with the lapse of plasma processing time while being gradually saturated, and becomes roughly constant at 20 sec or more of the plasma processing time. Such a self-saturating tendency of the production amount of a reaction product is quite similar to a natural oxidation phenomenon of a metal surface or a silicon surface. Since formation of the surface reaction layer is thus self-saturating, performing plasma processing for a period longer than time required for the saturation makes it possible to adjust the amount of the surface reaction layer 404 produced per cycle to be constant. Although 20 sec is taken for saturation of the production amount of the surface reaction layer 404 in this embodiment, the time for saturation varies depending on apparatus parameters such as a distance between the plasma source (12, 34) and the wafer 2 or substrate temperature.

After the lapse of the plasma processing time required for saturation of production of the surface reaction layer, at time t3 shown in FIG. 3, according to an instruction signal from the control part 40, output of the high-frequency power from the high-frequency power source 20 is stopped, and supply of the processing gas to the discharge region 3 is also stopped. As a result, the plasma 10 in the discharge region 3 disappears. In a period from time t3 to time t4, the processing gas and particles such as the reactive particles in the processing chamber 1 are exhausted to the outside of the processing chamber 1 via the evacuation pipe 16, the opening degree of which is adjusted by the pressure regulating means 14, and the exhaust means 15.

At time t4, the infrared lamp 62 is turned on according to an instruction signal from the control part 40, and as illustrated in (c) of FIG. 4, the surface of the wafer 2 is heated under vacuum by light (infrared light) 405 radiated from the infrared lamp 62. At this time, pressure in the processing chamber 1 is, for example, $1 \times 10^{-3}$ Pa, and emission time of the infrared lamp is, for example, 15 sec. The highest reachable temperature of the wafer surface o is, for example, 150° C. Such a step corresponds to a reaction of decomposing the surface reaction layer 404 into reaction products 406 such as tantalum fluoride, ammonia, and hydrogen fluoride and volatizing or eliminating the reaction products. Such an elimination reaction is more accelerated with higher temperature and lower pressure. The inventors have newly found that surface temperature of the wafer 2 of 100° C. or higher and pressure in the processing chamber 1 of 100 Pa or less are necessary to induce the elimination reaction.

Although the highest reachable temperature of the wafer surface is 150° C. and the degree of vacuum in the processing chamber 1 is $1 \times 10^{-3}$ Pa in this embodiment, the highest reachable temperature may be accordingly set to an appropriate value in a temperature range of 100° C. or higher. A typical temperature range is 100 to 300° C., and a typical pressure range in the processing chamber 1 during heating is $1 \times 10^{-5}$ to 100 Pa.

Figure 7:
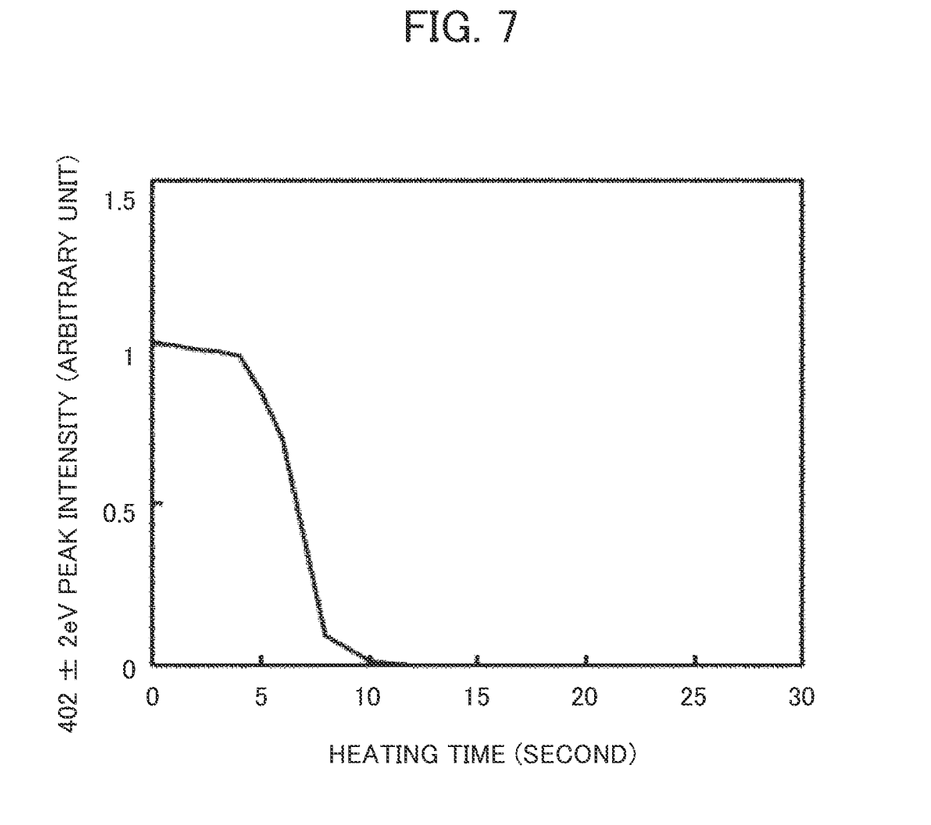
FIG. 7 illustrates heating time dependence of the remained amount of the surface reaction layer according to the embodiment.

FIG. 7 is a graph illustrating change in peak intensity of 402±2 eV due to the surface reaction layer 404 with respect to heating time when the surface reaction layer 404 is removed by heating of the infrared lamp 62 with a reachable temperature of 150° C. FIG. 7 reveals that heating of the surface of the wafer 2 by irradiation of infrared light 405 from the infrared lamp 62 decreases the peak intensity of 402±2 eV showing the remained amount of the surface reaction layer 404, and the surface reaction layer 404 disappears at heating time of 10 sec. In this heating step, only the surface reaction layer 404 generated on the surface of the wafer 2 is decomposed and volatized, and the unreacted tantalum nitride film 402 under the surface reaction layer 404 is not changed at all, and thus only a portion of the surface reaction layer 404 can be removed. Hence, the step of removing the surface reaction layer 404 is also self-saturating in addition to the step of forming the surface reaction layer 404.

In this heating step, while the wafer 2 is mounted on the wafer stage 4, supply of helium gas used for improving heat conduction of the back of the wafer is stopped to promptly raise temperature of the surface of the wafer 2. Although the wafer 2 is processed while being mounted on the wafer stage 4 in this embodiment, the wafer 2 may be irradiated with infrared light while being not thermally in contact with the wafer stage 4 by using a lift pin (not shown), for example. After lapse of heating time necessary for removing the surface reaction layer 404, the infrared lamp 62 is turned off, and residual gas in the processing chamber 1 is exhausted to the outside of the processing chamber 1 using the exhaust means 15. Subsequently, supply of helium gas is restarted to increase heat conduction between the wafer 2 and the wafer stage 4, and wafer temperature is cooled to −20° C. by the chiller 38. This is the end of the first cycle of processing.

At time t5 shown in FIG. 3, the infrared lamp 62 is turned off according to an instruction signal from the control part 40. The gas containing the reaction product particles in the processing chamber 1 is exhausted to the outside of the processing chamber 1 via the evacuation pipe 16, the opening degree of which is adjusted by the pressure regulating means 14, and the exhaust means 15. After time t5, as described with reference to FIG. 2, whether the etching amount or residual film thickness of the tantalum nitride film 402 on the wafer 2 reaches a desired value is determined (corresponding to step S207), and a subsequent cycle (S201 to S206) is started or a step of finishing the processing of the wafer 2 is performed depending on a determination result.

In case of starting a subsequent cycle, at any appropriate time t6 at and after time t5, according to an instruction signal from the control part 40, introduction of the $CF_4/H_2/N_2$ gas into the discharge region 3 is started as with the operation from time t1. That is, the step of forming the surface reaction layer 404 as described with reference to (b) of FIG. 4 and the step of eliminating the surface reaction layer by heating as described with reference to (c) of FIG. 4 are performed as the subsequent cycle. In case of finishing the processing of the wafer 2, supply of He gas into the gap between the back of the wafer 2 and the upper surface of the stage 4 is stopped, the valve 52 is opened to discharge the He gas from the gap so that pressure in the gap is similar to pressure in the processing chamber 1, and a step of releasing electrostatic adsorption of the wafer 2, the step including removal of static electricity, is performed at time t6. This is the end of the step of etching processing of the tantalum nitride film 402.

Figure 8:
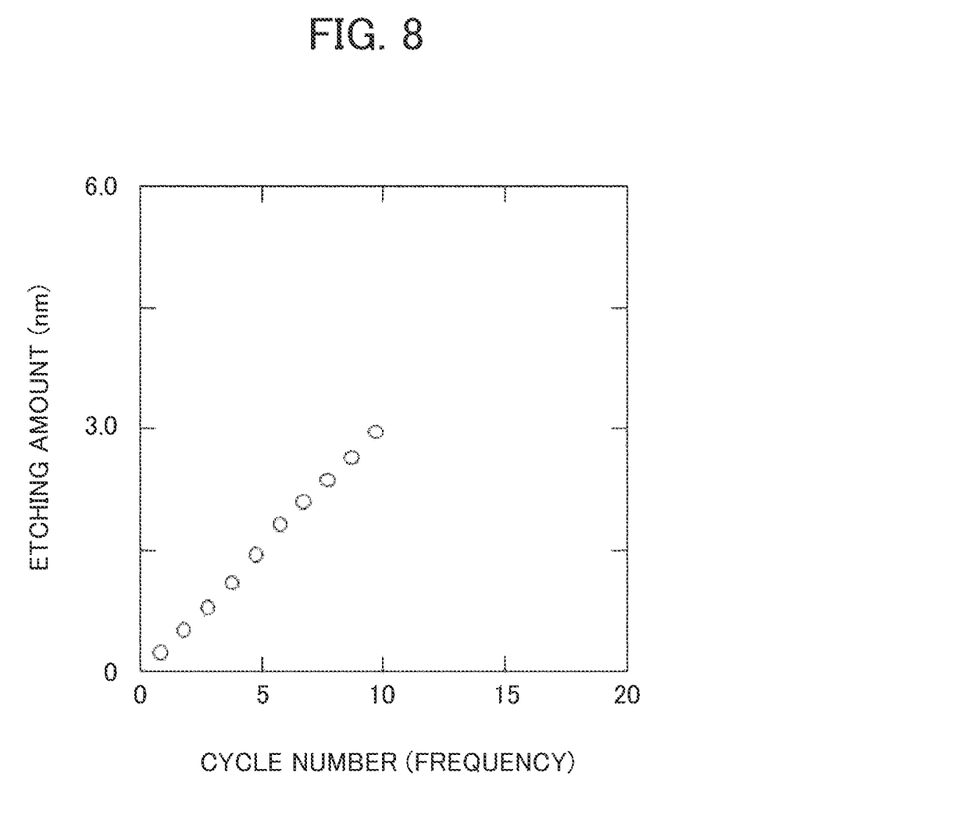
FIG. 8 is a graph illustrating a relationship between cycle number and etching amount in etching processing performed by the plasma processing apparatus according to the embodiment.

In this embodiment, when the etching amount of 3 nm is required, the above cycle is repeated ten times and then the etching is finished. FIG. 8 is a graph illustrating a relationship between cycle number and etching amount in etching processing performed by the plasma processing apparatus according to the embodiment as shown in FIG. 1. In FIG. 8, the horizontal axis indicates the number of cycle times, and the vertical axis indicates the etching amount (etching depth) detected using In-situ ellipsometry before start of the subsequent cycle.

As illustrated in FIG. 8, the etching amount changes approximately linearly with an increase in the number of cycle times in this embodiment. FIG. 8 reveals that the etching amount per cycle of the tantalum nitride film is, for example, 0.3 nm/cycle in the embodiment.

As described above, the first step of forming the surface reaction layer 404 and the second step of removing the surface reaction layer 404 in this embodiment are each ended in a self-saturating manner. Hence, in the embodiment, in case of etching the wafer 2 on which a film structure having a circuit pattern is beforehand formed, the etching amount of the surface of the tantalum nitride film 402 after finishing one cycle is reduced in variation in both the in-plane direction and the depth direction of the wafer 2 and can be made roughly uniform.

Since such a self-saturating tendency is used, even if density of the reactive particles such as radicals supplied to the wafer 2 has different distributions depending on positions in the horizontal or depth direction of the upper surface of the wafer 2, the etching amount is suppressed from being larger more than necessary or being insufficient, resulting in a reduction in variation of the etching amount. In addition, the total etching amount can be adjusted by increasing or decreasing the number of times of a cycle including the above first and second steps. Thus, in this embodiment, the total etching amount coincides with times multiple or number of times of addition of the etching amount per cycle. As a result, the embodiment makes it possible to improve dimension controllability after etching processing and improve a processing yield compared with the previous etching with continuous plasma processing.

As described above, according to this embodiment, it is possible to provide an isotropic atomic-layer etching technique enabling etching of a tantalum nitride film with high uniformity in a wafer in-plane direction or a pattern depth direction and with high processing dimension controllability at an atomic layer level.

Although the infrared lamp 62 is disposed outside the vacuum chamber above the processing chamber 1 in the periphery of the quartz chamber 12 surrounding the discharge region 3 in the plasma processing apparatus 100 of FIG. 1, the infrared lamp 62 may be disposed inside the quartz chamber 12 or the vacuum chamber. The above-described embodiment has been described in detail to clearly explain the invention, and the invention is not necessarily limited to those having all the described configurations.

LIST OF REFERENCE SIGNS

1 Processing chamber
2 Wafer
3 Discharge region
4 Stage
5 Shower plate
6 Top board
10 Plasma
11 Base chamber
12 Quartz chamber
14 Pressure regulating means
15 Exhaust means
16 Evacuation pipe
17 Gas dispersion plate
20 High-frequency power source
22 Matching box
25 High-frequency cut filter
30 Electrostatic adsorption electrode
31 DC power source
34 ICP coil
38 Chiller
39 Refrigerant channel
40 Control part
41 Calculation part
50 Mass flow controller
51 Mass-flow-controller control part
52 Valve
60 Container
62 Infrared lamp
63 Reflecting plate
64 Infrared lamp power source
70 Thermocouple
71 Thermocouple thermometer
74 Light transmitting window
75 Gas channel
78 Slit plate
81 O ring
92 Optical fiber
93 External infrared light source
94 Optical path switch
95 Optical distributer
96 Spectroscope
97 Detector
98 Optical multiplexer
100 Plasma processing apparatus
401 Base film
402 Tantalum nitride film
403 Active species
404 Surface reaction layer
406 Reaction product
901 Base structure
902 Fin structure
903 Tantalum nitride film
904 Carbon film
905 Reaction species
906 Reaction product

The invention claimed is:

1. An etching method for etching a film layer as a processing object containing nitride of transition metal including tantalum nitride, the film layer being disposed on a surface of a wafer, the method comprising the steps of:
supplying reactive particles containing fluorine and hydrogen but containing no oxygen to a surface of the film layer to form a reaction layer which mainly contains a tantalum-fluorine bond and nitrogen-hydrogen bond and has a self-saturating tendency on the surface of the film layer; and
eliminating the reaction layer by heating the film layer.

2. The etching method according to claim 1, wherein the reactive particles containing fluorine and hydrogen but containing no oxygen are formed of a gas composed of carbon fluoride, hydrogen, and nitrogen.

3. The etching method according to claim 1, wherein the reactive particles are formed by plasma using a gas containing fluorine and hydrogen but containing no oxygen.

4. The etching method according to claim 1, wherein a plurality of steps including the step of forming the reaction layer and the step of eliminating the reaction layer are combined as one cycle, and the cycle is repeated multiple times.

5. The etching method according to claim 1, wherein a mask layer containing carbon is disposed above the film layer as the processing object.

* * * * *